US006603416B2

United States Patent
Masenas et al.

(10) Patent No.: US 6,603,416 B2
(45) Date of Patent: Aug. 5, 2003

(54) METHOD AND CIRCUIT FOR DYNAMIC CALIBRATION OF FLASH ANALOG TO DIGITAL CONVERTERS

(75) Inventors: Charles J. Masenas, Essex Junction, VT (US); Chad E. Mitchell, Kasson, MN (US); Steven J. Tanghe, Essex Junction, VT (US); Sharon L. Von Bruns, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/968,218

(22) Filed: Oct. 1, 2001

(65) Prior Publication Data

US 2003/0063020 A1 Apr. 3, 2003

(51) Int. Cl.$^7$ ................................. H03M 1/12
(52) U.S. Cl. .................. 341/120; 341/118; 341/155
(58) Field of Search ................ 341/118, 120, 341/155, 163, 154, 143

(56) References Cited

U.S. PATENT DOCUMENTS

| | | | | | |
|---|---|---|---|---|---|
| 4,222,107 A | * | 9/1980 | Mrozowski et al. | ........ | 702/107 |
| 4,490,713 A | * | 12/1984 | Mrozowski et al. | ........ | 341/163 |
| 5,146,155 A | * | 9/1992 | Trinh Van et al. | ........ | 324/99 D |
| 5,164,620 A | * | 11/1992 | Kalaf | .......................... | 327/306 |
| 5,821,795 A | * | 10/1998 | Yasuda et al. | ............... | 327/307 |
| 5,874,909 A | * | 2/1999 | Soenen et al. | ............... | 341/141 |
| 6,081,215 A | * | 6/2000 | Kost et al. | ................... | 341/120 |
| 6,252,536 B1 | * | 6/2001 | Johnson et al. | ............. | 341/155 |
| 6,281,818 B1 | * | 8/2001 | Miller | ......................... | 341/120 |
| 6,351,228 B1 | * | 2/2002 | Kutsuno et al. | ............ | 341/120 |
| 6,404,375 B1 | * | 6/2002 | Munoz et al. | ............... | 341/118 |
| 6,407,685 B1 | * | 6/2002 | Handel et al. | ............... | 341/118 |

* cited by examiner

*Primary Examiner*—Peguy Jeanpierre
(74) *Attorney, Agent, or Firm*—McGinn & Gibb, PLLC; Richard A. Henkler, Esq.

(57) ABSTRACT

A method and structure for calibrating an analog to digital converter comprises an input signal; a driver receiving the input signal, wherein the driver outputs a driver output signal; a flash circuit receiving the driver output signal, wherein the flash circuit outputs a comparison result equaling $2^n-1$ digital outputs; an encoding logic unit encoding the comparison result into n digital bits as an output signal; a calibration engine outputting a calibration input adjust signal, a reference adjust signal, a driver gain adjust signal, a driver offset adjust signal; and a calibration input circuit receiving the calibration input adjust signal, wherein the driver receives the driver gain adjust signal and the driver offset adjust signal, wherein the flash circuit receives the reference adjust signal, wherein the calibration engine receives n digital bits, and controls an operation of the driver or flash circuit based on the output signal.

36 Claims, 4 Drawing Sheets

METHOD AND CIRCUIT FOR DYNAMIC CALIBRATION OF FLASH ANALOG TO DIGITAL CONVERTERS

BACKGROUND OF THE INVENTION

1. Field of the Invention

The present invention generally relates to electronic circuits designed for semiconductor integrated circuit manufacturing, and more particularly to an electronic circuit for dynamically calibrating an analog to digital converter.

2. Description of the Related Art

Low voltage all CMOS flash Analog to Digital Converters (ADC) face the competing requirements of speed and accuracy. On one hand, conversion rates are in the multi-Gigasample per second range. On the other hand, decreasing power supply voltages require that comparators must discriminate between analog signals separated by mere millivolts. As a result, the small device sizes required and the process variations associated with semiconductor integrated circuit manufacturing necessitate the need for the calibration of Analog to Digital Converters for gain, offset, and symmetry to minimize non-idealities.

Calibration has typically been accomplished with the clocked portion of the flash ADC held in a fixed state, while the gain or offset of the front end is adjusted in response to the result of a DC or quasi-static comparison between an output and a reference. This method accomplishes calibration of the DC offset and DC gain, but does not address the dynamic offset or dynamic gain of the full ADC under normal operating conditions, which includes the clocking of the ADC back end.

To accomplish DC or quasi-static calibration automatically, one method in use, as described in U.S. Pat. No. 6,226,562, the complete disclosure of which is herein incorporated by reference, involves a generic calibrate engine for calibrating the analog circuits on a chip, where the output of an analog circuit is coupled into the input of a separate precision analog comparator that functions only during calibration. During calibration of the analog circuit, the output of the precision analog comparator is fed into the input of the calibration engine that drives the calibration. Thus, a separate precision analog comparator that adds design time, space, and manufacturing cost is needed.

U.S. Pat. No. 5,990,814, the complete disclosure of which is herein incorporated by reference, describes a calibration method for compensating both static and dynamic offsets of individual single-stage or multi-stage comparators while the comparator is operating in an ADC under normal operating conditions, including ADC clocking and control signals. This method incrementally adjusts the threshold value of each comparator. Thus, each individual component is calibrated, not the entire ADC system or unit. Therefore, this method cannot be used to correct the overall gain or overall offset of the ADC.

Thus, in light of the shortcoming of the conventional calibration methods, there exists a need for a new and improved circuit and method for dynamic calibration of flash analog to digital converters as an entire system or unit.

SUMMARY OF THE INVENTION

In view of the foregoing and other problems, disadvantages, and drawbacks of the conventional calibration methods, the present invention has been devised, and it is an object of the present invention to provide a circuit and method for dynamically calibrating an analog to digital converter. It is another object of the present invention to calibrate the entire ADC as a system or unit. Another object of the present invention is to calibrate the overall gain and overall offset of the system. Yet another object of the present invention is to calibrate the ADC in its operational mode. Another object of the present invention is to calibrate the ADC based on the binary encoded output codes that are the output of the ADC system.

In order to attain the objects suggested above, there is provided, according to one aspect of the invention, a circuit and method for dynamically calibrating an analog to digital converter (ADC), wherein the circuit comprises means for providing a signal having a known binary value representation to the ADC; and means for altering the gain or other parameters of the ADC to provide the known binary value.

Furthermore, the invention includes a method for dynamically calibrating an analog to digital converter, the method comprises inputting an input signal into a plurality of comparators; monitoring a binary encoded output code; detecting a calibration target for the output code; calibrating an overall system gain; and calibrating an overall system offset.

More precisely, a circuit for dynamically calibrating an analog to digital converter comprises a voltage source having an input voltage signal; a driver receiving the input voltage signal, wherein the driver outputs a driver output signal; a flash circuit receiving the driver output signal, wherein the flash circuit outputs a comparison result equaling $2^n-1$ digital outputs; an encoding logic unit encoding the comparison result ($2^n-1$ digital outputs) into n digital bits as an output signal; a calibration engine connected to said encoding logic and receiving said output signal, and further outputting a calibration input adjust signal, a reference adjust signal, a driver gain adjust signal, a driver offset adjust signal; and a calibration input circuit receiving the calibration input adjust signal, wherein the driver further receives the driver gain adjust signal and the driver offset adjust signal, wherein the flash circuit further receives the reference adjust signal, wherein the calibration engine receives n digital bits, and wherein said calibration engine controls an operation of said driver or said flash circuit based on said output signal.

The driver comprises a fixed or variable gain amplifier. The driver adjusts the driver output signal based on the driver offset adjust signal and the driver gain adjust signal. Moreover, the flash circuit adjusts internal reference voltages based on the reference adjust signal which effectively modifies the overall ADC gain. The calibration input circuit controls the input voltage signal into the driver based on the calibration input adjust signal. Additionally, the n digital bits comprise a feedback and determine the calibration input adjust signal, the reference adjust signal, the driver gain adjust signal, and the driver offset adjust signal.

The input voltage signal comprises a plurality of differential analog input signals. Also, the analog input signals are coupled to a high pass filter, wherein the high pass filter is coupled to a common mode control circuit, and wherein the common mode control circuit provides a reference voltage level.

Furthermore, the high pass filter is coupled to a track and hold circuit comprising a clock signal, wherein the track and hold circuit samples the input voltage signal when the clock signal articulates into a hold polarity, and wherein differential outputs of the track and hold circuit are coupled into inputs of the driver.

Additionally, the flash circuit comprises $2^n-1$ comparators and a ladder resistor string, wherein the ladder resistor string provides a series of differential reference voltages for the $2^n-1$ comparators.

The flash circuit is coupled to an encoding logic unit which encodes the $2^n-1$ digital outputs which are the comparison result from the flash circuit into n digital bits.

As mentioned, the entire ADC is calibrated as a system or unit. Thus, the overall gain and overall offset of the system are calibrated, as opposed to the gain or offset of individual component circuits in the ADC separated out from the system during calibration. Also, the ADC is calibrated as it is operated under normal conditions, with all comparators enabled and clocked at a rate within the normal operating range, with the driver and the T/H operational. The calibration engine monitors the n digital bits that are the ADC output signal, and automatically adjusts gain or offset until a specified programmable ADC output code target is met.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF PREFERRED EMBODIMENTS OF THE INVENTION

As previously mentioned, there is a need for a new and improved circuit and method for dynamic calibration of flash analog to digital converters as an entire system or unit. The new and improved circuit and method includes calibration of the overall gain and overall offset of the analog to digital converter system, as opposed to the gain or offset of individual component circuits separated out from the system. Further, the system is calibrated under the clocked conditions of normal operation, and the binary encoded output codes that are the normal output of the system are coupled as inputs into the calibration engine that drives the calibration. Conventional methods utilize a generic calibration engine for calibrating the analog circuits on a chip, where the output of an analog circuit is coupled into a separate precision analog comparator that functions only during calibration. During calibration of the analog circuit, the output of the precision analog comparator is fed into the input of the calibration engine that drives the calibration. Thus, the present invention avoids the design time, space, and manufacturing costs associated with a separate precision analog comparator controlling the calibration engine.

Figure 2:
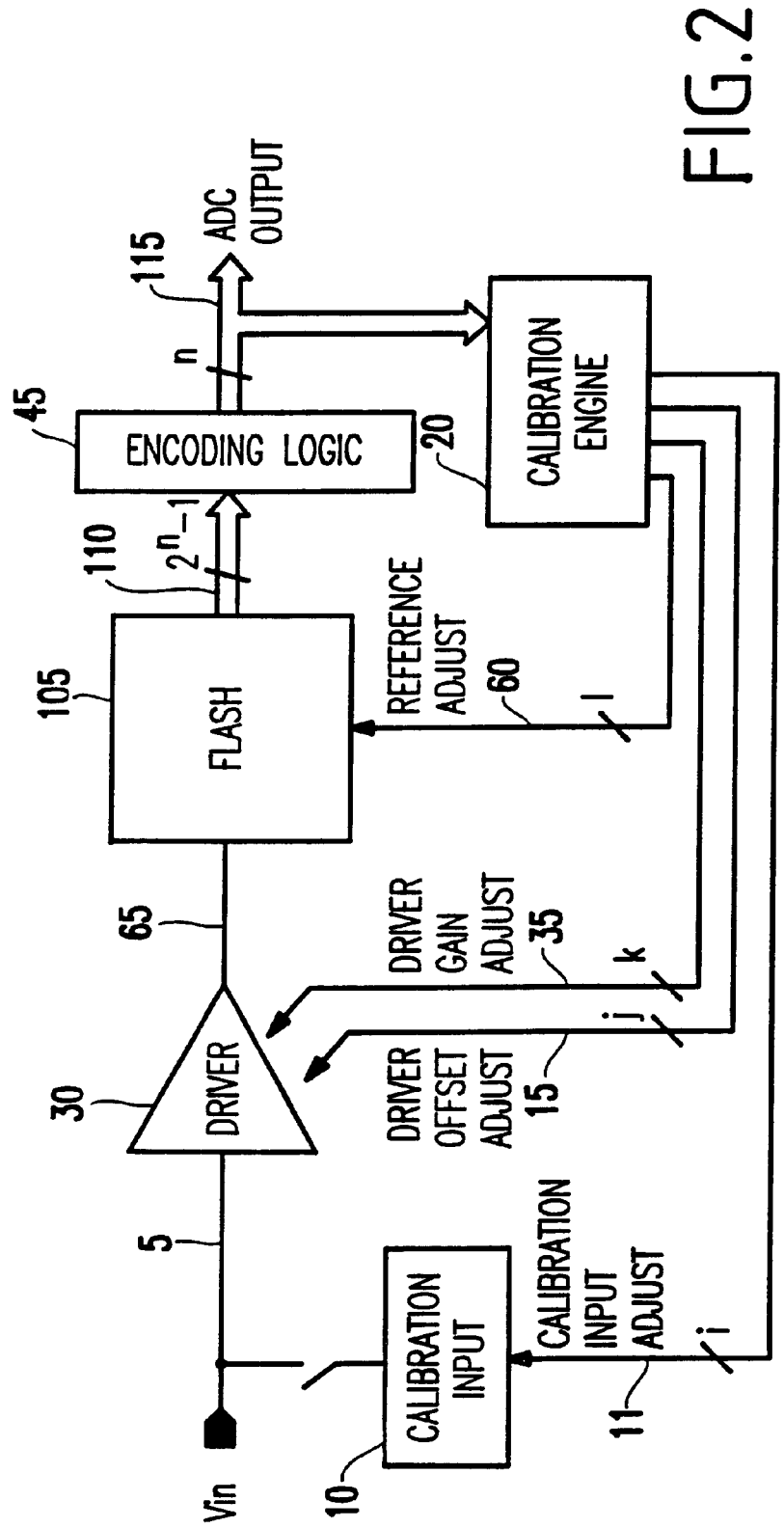
FIG. 2 is a block diagram of an analog to digital converter with dynamic calibration according to the present invention.
Figure 3:
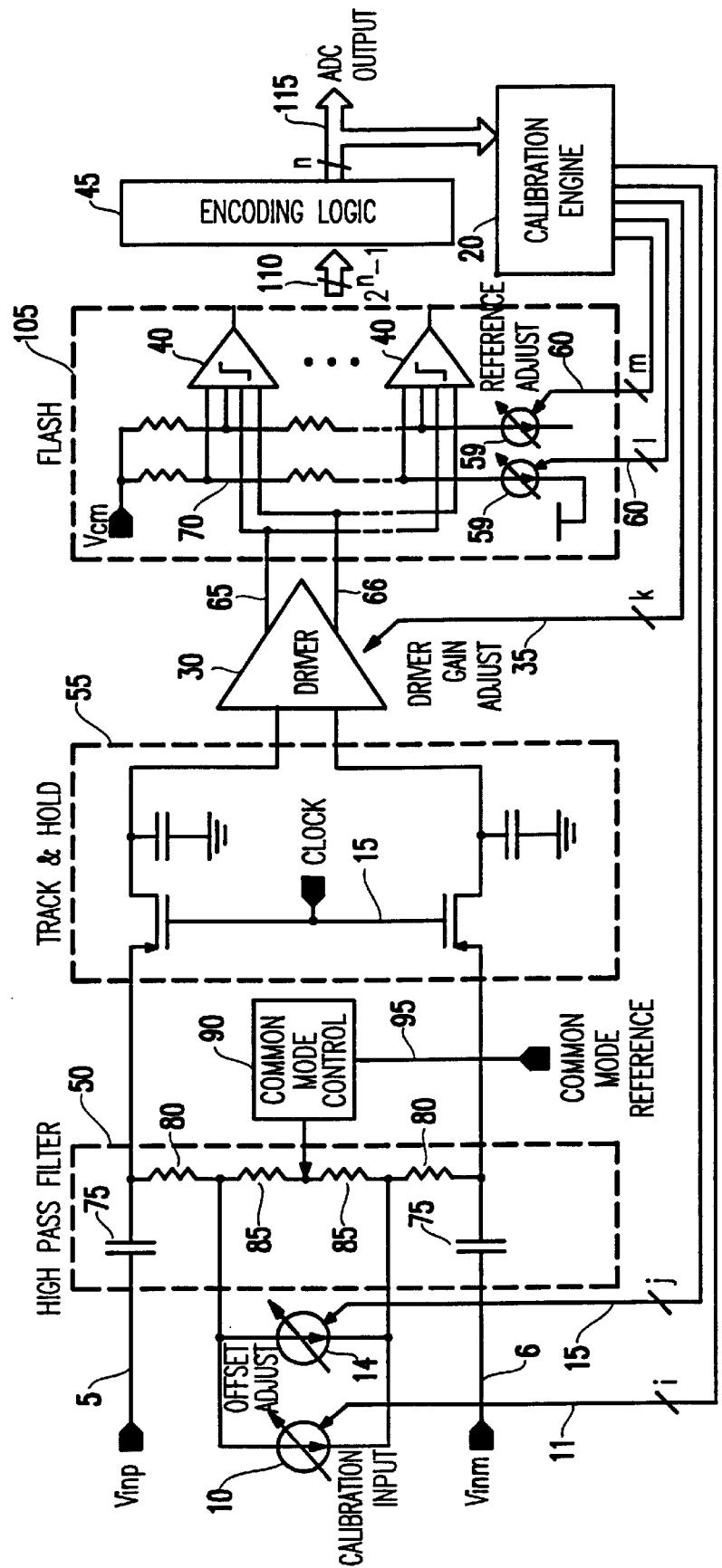
FIG. 3 is a block diagram of another embodiment of an analog to digital converter with dynamic calibration according to the present invention.
Figure 4:
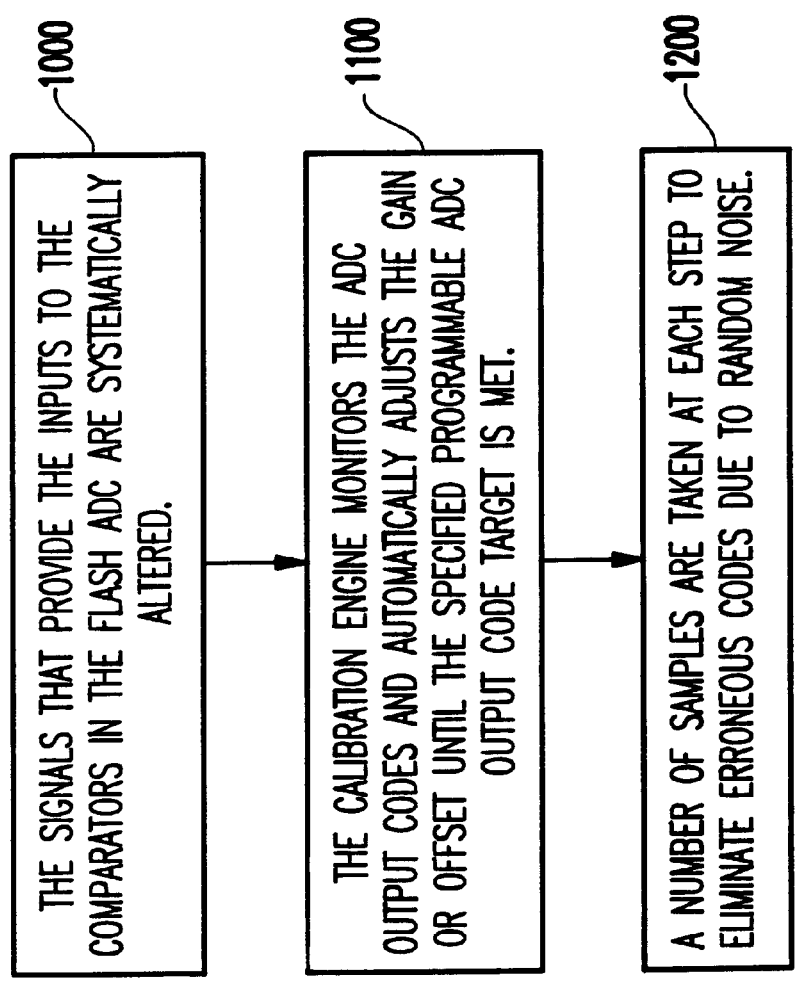
FIG. 4 is a flow diagram illustrating a preferred method of the invention.

Referring now to the drawings, and more particularly to FIGS. 2 through 4, there are shown preferred embodiments of the method and structures according to the present invention.

Specifically, in FIGS. 2 through 4, there is shown a circuit diagram and methodology for the dynamic calibration of an analog to digital converter circuit, wherein the calibration minimizes the offset and adjusts the gain of the full ADC under the clocked conditions of normal operation. The entire ADC is calibrated as a system or unit. Thus, the overall gain and overall offset of the system are calibrated.

The calibration circuit and method of the present invention provides for an ADC clocked at a rate within the normal operating range. The ADC is calibrated as it is operated under normal conditions, with all comparators enabled and clocked at a rate within the normal operating range, and with the driver and the T/H operational. The calibration process corrects for time-independent as well as time-dependent non-idealities such as a mismatch in parasitic capacitance and charge injection, and non-idealities associated with full circuit operation such as power supply drops.

Furthermore, an input is provided by on-chip circuitry, such as a digital to analog converter (DAC) that can provide a constant DC voltage to the input of the ADC, or a sinusoid of fixed amplitude and frequency. The input is adjustable and selectable.

The circuit signal used to monitor the progress of the calibration is the ADC binary encoded output code.

Moreover, the calibration target for the output code is programmable and selectable, and maybe chosen as appropriate for the application of the ADC. For example, the calibration target for the midpoint gain of a 6 bit ADC in a read channel used in the electronics of a hard disk drive may be the sync field targets [+16, −16, 0] used in read acquisition.

Peak detection circuitry in the calibrate engine monitors the ADC output codes so that the calibration engine can automatically adjust gain or offset adjust signals. A number of samples are taken at each calibration step, and the most frequent code or average code or the code whose frequency meets a predetermined threshold is the code compared with the target. This eliminates erroneous codes due to random noise.

Furthermore, a successive approximation algorithm can be used to adjust the gain or offset adjust signals.

The calibration results which are the final settings for the gain, offset, and reference adjust signals are stored in registers or memory cells on the chip.

The present invention operates in the following manner: to dynamically calibrate the gain or the offset, the signals that provide the inputs to the comparators in the flash ADC are systematically altered and the ADC binary encoded output code is monitored until the calibration target for the output code is detected. The signals that can be altered to calibrate the gain include the output level of the driver controlled by the driver gain adjustment, and the voltages across the reference ladder controlled by the reference adjustment. The signal that can be altered to calibrate the offset includes the offset of the driver output controlled by the driver offset adjustment.

The ADC is calibrated as a system under the clocked conditions of normal operation, without the need for a separate precision analog comparator. The overall gain and overall offset are calibrated, as opposed to the gain or offset of individual component circuits within the ADC that are separated out from the system during calibration. The calibration engine monitors the ADC output codes and automatically adjusts gain or offset until a specified programmable ADC output code target is met. A number of samples are taken at each step to eliminate erroneous codes due to random noise.

Figure 1:
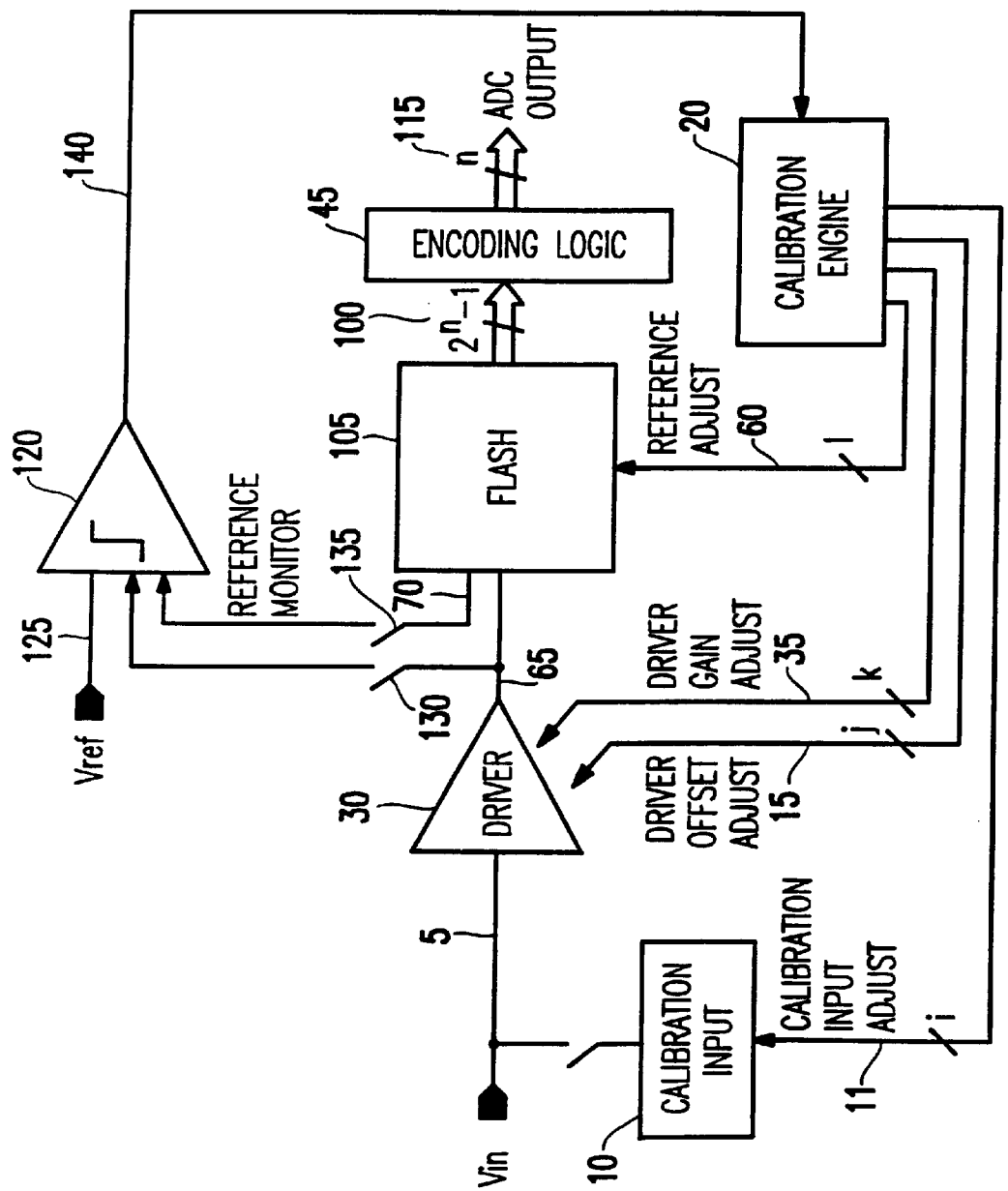
FIG. 1 is a block diagram of a conventional analog to digital converter with calibration using a dedicated analog comparator.

In FIG. 1, a block diagram of a conventional analog to digital converter with calibration using a dedicated analog comparator is shown. The function of the analog to digital converter (ADC) during normal operation will be described first. Voltage input signal $V_{in}$ 5 is the analog signal provided as input to the ADC for conversion to its digital equivalent. Voltage input signal 5 is coupled to the input of Driver 30, which is a fixed or variable gain amplifier and driver with driver output signal 65. Driver output signal 65 is then coupled to the input of the Flash circuit 105. The Flash circuit 105 compares the driver output signal 65 with internal reference voltages and outputs $2^n-1$ digital outputs 110 in accordance with the comparison result. The $2^n-1$ digital outputs 110 are coupled to the Encoding Logic 45, which encodes them to n digital bits 115, the final result of the ADC. During normal operation, switch 130 decouples driver output signal 65 from Calibrate Comparator 120, and switch 135 decouples Reference Monitor 70 from Calibrate Comparator 120.

During the automatic quasi-static calibration procedure associated with FIG. 1, Calibration Input circuit 10 is coupled to the input of Driver 30 and the Calibration Input Adjust signals 11 which are output from Calibration Engine 20 control the signal input of Driver 30. Either switch 130 couples driver output signal 65 to Calibrate Comparator 120, or switch 135 couples Reference Monitor signal 70 to Calibrate Comparator 120, depending on the parameter being calibrated. Reference signal $V_{ref}$ 125 is coupled to the Calibrate Comparator 120, and is set to a level appropriate for the parameter being calibrated. The digital output 140 of Calibrate Comparator 120 is coupled to the input of Calibration Engine 20. This input to the Calibration Engine 20 constitutes feedback that is used to determine the set of outputs generated by Calibration Engine 20. These outputs of Calibration Engine 20 control the appropriate adjust circuitry in accordance with an algorithm until the target result is achieved.

More specifically, for the calibration of the offset, input signal $V_{in}$ 5 receives no external input. Calibration Input Adjust signals 11 are set by Calibration Engine 20 so that Calibration Input 10 provides the same voltage as the target midpoint input level of the Driver 30 at input signal $V_{in}$ 5. Switch 130 couples driver output signal 65 to Calibrate Comparator 120. Reference signal $V_{ref}$ 125 is coupled to the Calibrate Comparator 120, and is set to the same voltage as the target midpoint output level of the Driver 30. Driver offset adjust signals 15 comprise j control signal inputs from Calibration Engine 20 which control the offset of Driver 30. These j control signal inputs are varied by Calibration Engine 20 until Driver output signal 65 matches Reference signal $V_{ref}$ 125, which zeroes out the offset.

For the calibration of the Reference Monitor 70, input signal $V_{in}$ 5 receives no external input. Calibration Input Adjust signals 11 are set by Calibration Engine 20 so that Calibration Input 10 provides the same voltage as the target midpoint input level of the Driver 30 at input signal $V_{in}$ 5. Switch 135 couples Reference Monitor signal 70 to Calibrate Comparator 120. Reference signal $V_{ref}$ 125 coupled to the Calibrate Comparator 120 is set to a predetermined voltage. Reference Adjust signals 60 are coupled to the input of Flash circuit 105 and comprise 1 control signal inputs from Calibration Engine 20. Reference Adjust signals 60 provide adjustment of the reference voltages internal to Flash circuit 105, and are varied until the voltage at Reference Monitor signal 70 matches that of reference signal $V_{ref}$ 125.

For the calibration of the gain of Driver 30, input signal $V_{in}$ 5 receives no external input. Calibration Input Adjust signals 11 are set by Calibration Engine 20 so that Calibration Input 10 provides a predetermined voltage at input signal $V_{in}$ 5. Switch 130 couples driver output signal 65 to Calibrate Comparator 120. Reference signal $V_{ref}$ 125 coupled to the Calibrate Comparator 120 is set to the same predetermined voltage that is used for the Reference Monitor 70 calibration. Driver 30 receives k Driver Gain Adjust signals 35 from Calibration Engine 20 which adjust the gain. These k inputs are varied until the voltage at the driver output signal 65 matches that of reference signal $V_{ref}$ 125.

In FIG. 2, a block diagram of an analog to digital converter with dynamic calibration, in accordance with the present invention, is shown. The function of the analog to digital converter (ADC) during normal operation, described with reference to FIG. 1, applies to FIG. 2 as well. During the dynamic calibration procedure, the n bits 115 that are the digital result of the ADC are produced in the same way as during normal operation, and are coupled as input to the Calibration Engine 20. These n bits 115 constitute the feedback that is used to determine the set of outputs generated by Calibration Engine 20. These outputs of Calibration Engine 20 control the appropriate adjust circuitry in accordance with an algorithm until the target n bit result 115 is achieved.

More specifically, for the dynamic calibration of the offset, input signal $V_{in}$ 5 receives no external input. Calibration Input Adjust signals 11 are set by Calibration Engine 20 so that Calibration Input 10 provides the same voltage as the target midpoint input level of the Driver 30 at input signal $V_{in}$ 5. Driver offset adjust signals 15 comprise j control signal inputs from Calibration Engine 20 which control the offset of Driver 30. These j control signal inputs are varied by Calibration Engine 20 until the n bits 115 that are the digital result of the ADC match the predetermined target.

For the dynamic calibration of the gain of Driver 30, input signal $V_{in}$ 5 receives no external input. Calibration Input Adjust signals 11 are set by Calibration Engine 20 so that Calibration Input 10 provides a predetermined voltage at input signal $V_{in}$ 5. Driver 30 receives k Driver Gain Adjust signals 35 from Calibration Engine 20 which adjust the gain. These k inputs are varied until the n bits 115 that are the digital result of the ADC match the predetermined target.

For the dynamic calibration of the internal reference voltages used in the comparisons that generate the $2^n-1$ digital outputs 110, input signal $V_{in}$ 5 receives no external input. Calibration Input Adjust signals 11 are set by Calibration Engine 20 so that Calibration Input 10 provides a predetermined voltage at input signal $V_{in}$ 5. Reference Adjust signals 60 are coupled to the input of Flash circuit 105 and comprise 1 control signal inputs from Calibration Engine 20. Reference Adjust signals 60 provide adjustment of the reference voltages internal to Flash circuit 105, and are varied until the n bits 115 that are the digital result of the ADC match the predetermined target.

FIG. 3 is a block diagram of an embodiment of an analog to digital converter with dynamic calibration in accordance with the present invention. The function of the analog to digital converter (ADC) during normal operation will be described first. Differential input signals $V_{inp}$ 5 and $V_{inm}$ 6 are the analog signals provided as input to the ADC for conversion to their digital equivalent. Differential input signals 5 and 6 are coupled to the high pass filter 50, which filters out noise below the high pass filter cutoff frequency and provides AC coupling between the source of differential input signals 5 and 6 and the Track and Hold circuit 55. High pass filter 50 is comprised of resistors 80 and 85 in series, and capacitors 75 in a standard single pole RC high pass filter configuration. Common Mode Control circuit 90 is coupled at the midpoint of resistors 85, and controls the common mode voltage level of the front end of the ADC. Common Mode Reference 95 is coupled to Common Mode Control circuit 90, and provides the reference voltage level for the common mode.

High pass filter 50 is coupled into Track and Hold circuit 55, which samples the signal when clock signal Clock 25 goes into the Hold polarity (when it transitions high in this embodiment). Track and Hold circuit 55 is optional and may be omitted or simply bypassed by holding clock signal Clock 25 in the Track polarity (low in this embodiment). The differential outputs of Track and Hold circuit 55 are coupled to the inputs of Driver 30, which is a fixed or variable gain amplifier and driver with differential output signals 65 and 66. Differential output signals 65 and 66 are then coupled to two of the inputs of the $2^n-1$ comparators 40 in the Flash circuit 105.

The $2^n-1$ comparators 40 in the Flash circuit 105 are also coupled to a ladder resistor string 70 that provides a series of differential reference voltage for the $2^n-1$ comparators 40. Each of the $2^n-1$ comparators 40 compares the differential output signals 65 and 66 with the differential reference voltage to which it is coupled, and outputs a digital signal in accordance with the comparison result. The $2^n-1$ digital outputs 110 of the $2^n-1$ comparators 40 are coupled to the Encoding Logic 45, which encodes the $2^n-1$ digital outputs 110 to n digital bits 115, the final result of the ADC.

During the dynamic calibration procedure, the n bits 115 that are the digital result of the ADC are produced in the same way as during normal operation, and are coupled as input to the Calibration Engine 20. These n bits 115 constitute the feedback that is used to determine the set of outputs generated by Calibration Engine 20. These outputs of Calibration Engine 20 control the appropriate adjust circuitry in accordance with an algorithm until the target n bit result 115 is achieved.

For the dynamic calibration of the offset, differential input signals $V_{inp}$ 5 and $V_{inm}$ 6 are shorted together. Calibration Input Adjust signals 11 are set by Calibration Engine 20 so that Calibration Input 10 provides no input at differential input signals $V_{inp}$ 5 and $V_{inm}$ 6. Offset Adjust circuit 14 receives j control signal inputs 15 from Calibration Engine 20 which control the current in a digital to analog converter (DAC), producing a variable voltage across resistors 85 in High Pass Filter 50. These j inputs 15 are varied until the n bits 115 that are the digital result of the ADC match the predetermined target.

For the dynamic calibration of the gain of Driver 30, differential input signals $V_{inp}$ 5 and $V_{inm}$ 6 receive no external input. If present, the Track and Hold circuit 55 (or sub circuit)is in Track mode. Calibration Input Adjust signals 11 are set by Calibration Engine 20 so that Calibration Input 10 provides a predetermined voltage at differential input signals $V_{inp}$ 5 and $V_{inm}$ 6. Driver 30 receives k Driver Gain Adjust signals 35 from Calibration Engine 20 which produce a variable resistance inside Driver 30 that controls the gain. These k inputs are varied until the n bits 115 that are the digital result of the ADC match the predetermined target.

For the dynamic calibration of the reference voltages provided by the ladder resistor string 70, differential input signals $V_{inp}$ 5 and $V_{inm}$ 6 receive no external input. If present, the Track and Hold circuit 55 (or sub circuit) is in Track mode. Calibration Input Adjust signals 11 are set by Calibration Engine 20 so that Calibration Input 10 provides a predetermined voltage at differential input signals $V_{inp}$ 5 and $V_{inm}$ 6. Reference Adjust signals 60 are coupled to the inputs of Reference Adjust digital to analog converters (DAC) 59 and comprises 1 and m control signal inputs from Calibration Engine 20. Reference Adjust signals 60 provide adjustment of the currents in Reference Adjust DACs 59, producing a variable voltage across ladder resistor string 70. These Reference Adjust signals 60 are varied until the n bits 115 that are the digital result of the ADC match the predetermined target.

FIG. 4 shows a flow diagram of the preferred method of the present invention, whereby the signals that provide the inputs to the comparators in the flash ADC are systematically altered 1000. Next, the calibration engine monitors 1100 the ADC output codes and automatically adjusts the gain or offset until the specified programmable ADC output code target is met. Finally, a number of samples are taken 1200 at each step to eliminate erroneous codes due to random noise.

As mentioned, the entire ADC is calibrated as a system or unit. Thus, the overall gain and overall offset of the system are calibrated, as opposed to the gain or offset of individual component circuits in the ADC separated out from the system during calibration. Also, the ADC is calibrated as it is operated under normal conditions, with all comparators enabled and clocked at a rate within the normal operating range, and with the driver and the T/H operational.

Additionally, the circuit signal used as feedback to drive the progress of the calibration is the ADC binary encoded n bit output code, which eliminates the need for a separate precision analog comparator. Moreover, the n bit calibration target is selectable and may be chosen as appropriate for the application.

While the invention has been described in terms of preferred embodiments, those skilled in the art will recognize that the invention can be practiced with modification within the spirit and scope of the appended claims.

What is claimed is:

1. An analog to digital converter circuit comprising:
   a driver receiving an analog input signal; and
   a calibration engine operatively connected to said driver, said calibration engine controlling an operation of said driver based on a digital output signal from said converter,
   wherein said digital output signal comprises gain and offset data and said calibration engine controls an operation of said driver based on said gain and offset data.

2. The circuit of claim 1, wherein said driver comprises one of a fixed and variable gain amplifier.

3. The circuit of claim 1, wherein said driver adjusts said driver output signal based on a driver offset adjust signal.

4. The circuit of claim 1, wherein said driver adjusts said driver output signal based on a driver gain adjust signal.

5. The circuit of claim 1, further comprising a flash circuit connected to said driver, wherein said flash circuit adjusts internal reference voltages based on a reference adjust signal output by said calibration engine.

6. The circuit of claim 5, wherein said flash circuit comprises $2^n-1$ comparators and a ladder resistor string, wherein said ladder resistor string provides a series of differential reference voltages for said $2^n-1$ comparators.

7. The circuit of claim 5, further comprising an encoding logic unit connected to said flash circuit, wherein said encoding logic unit encodes output from said flash circuit into n digital bits, and wherein said encoding logic unit outputs output codes having an adjustable target.

8. The circuit of claim 1, further comprising a calibration input circuit connected to said calibration engine, wherein said calibration input circuit controls an input voltage signal input to said driver, and wherein said calibration input circuit is adjustable and selectable, and wherein said input voltage signal is a sine wave.

9. The circuit of claim 1, wherein said driver receives a plurality of differential analog input signals.

10. The circuit of claim 1, wherein said analog input signals are coupled to a high pass filter, wherein said high pass filter is coupled to a common mode control circuit, and wherein said common mode control circuit provides a reference voltage level.

11. The circuit of claim 10, wherein said high pass filter is further coupled to a track and hold circuit comprising a clock signal, wherein said track and hold circuit samples said analog input signal when said clock signal articulates into a hold polarity, and wherein differential outputs of said track and hold circuit are coupled into inputs of said driver.

12. The circuit of claim 10, wherein said high pass filter is further coupled to a sub circuit comprising a clock signal, wherein said sub circuit samples said analog input signal when said clock signal articulates into a hold polarity, and wherein differential outputs of said sub circuit are coupled into inputs of said driver.

13. A circuit for dynamically calibrating an analog to digital converter, said circuit comprising:
   a voltage source having an input voltage signal;
   a driver receiving said input voltage signal, wherein said driver outputs a driver output signal;
   a flash circuit receiving said driver output signal, wherein said flash circuit outputs a comparison result;
   an encoding logic unit encoding said comparison result into n digital bits as an output signal, wherein said output signal comprises gain and offset data; and
   a calibration engine connected to said encoding logic and receiving said output signal,
   wherein said calibration engine controls an operation of said driver based on said gain and offset data.

14. The circuit of claim 13, wherein said driver comprises one of a fixed and variable gain amplifier.

15. The circuit of claim 13, wherein said driver adjusts said driver output signal based on said driver offset adjust signal.

16. The circuit of claim 13, wherein said driver adjusts the driver output signal based on said driver gain adjust signal.

17. The circuit of claim 13, wherein said flash circuit adjusts internal reference voltages based on said reference adjust signal.

18. The circuit of claim 13, wherein said calibration input circuit controls said input voltage signal into said driver based on said calibration input adjust signal.

19. The circuit of claim 13, wherein said n digital bits comprise a feedback and determine said calibration input adjust signal, and/or said reference adjust signal, and/or said driver gain adjust signal, and/or said driver offset adjust signal.

20. The circuit of claim 13, wherein said input voltage signal comprises a plurality of differential analog input signals.

21. The circuit of claim 13, wherein said analog input signals are coupled to a high pass filter, wherein said high pass filter is coupled to a common mode control circuit, and wherein said common mode control circuit provides a reference voltage level.

22. The circuit of claim 21, wherein said high pass filter is further coupled to a track and hold circuit comprising a clock signal, wherein said track and hold circuit samples said input voltage signal when said clock signal articulates into a hold polarity, and wherein differential outputs of said track and hold circuit are coupled into inputs of said driver.

23. The circuit of claim 13, wherein said flash circuit comprises $2^n-1$ comparators and a ladder resistor string, wherein said ladder resistor string provides a series of differential reference voltages for said $2^n-1$ comparators.

24. A method for dynamically calibrating an analog to digital converter, said method comprising:
   inputting a voltage signal from a voltage source;
   sending said voltage signal to a driver;
   outputting a driver output signal from said driver;
   sending said driver output signal to a flash circuit;
   outputting a comparison result from said flash circuit;
   sending said comparison result to an encoding logic unit;
   encoding said comparison result into n digital bits as an output signal, wherein said output signal comprises gain and offset data;
   inputting said n digital bits into a calibration engine;
   outputting a calibration signal from said calibration engine based on said gain and offset data; and
   controlling an operation of said driver using said calibration signal.

25. The method of claim 24, wherein in said step of sending said voltage signal to a driver, said driver comprises one of a fixed and variable gain amplifier.

26. The method of claim 24, wherein in said step of sending said driver output signal to a flash circuit, said driver adjusts said driver output signal based on a driver offset adjust signal.

27. The method of claim 24, wherein in said step of sending said driver output signal to a flash circuit, said driver adjusts said driver output signal based on a driver gain adjust signal.

28. The method of claim 24, wherein in said step of sending said driver output signal to a flash circuit, said flash circuit adjusts internal reference voltages based on said reference adjust signal.

29. The method of claim 24, wherein in said step of inputting said calibration input adjust signal to a calibration input circuit, said calibration input circuit controls said input voltage signal into said driver based on said calibration input adjustment signal.

30. The method of claim 24, wherein in said step of encoding said comparison result into n digital bits, said n digital bits comprise a feedback and determine said calibration input adjust signal, and/or said reference adjust signal, and/or said driver gain adjust signal, and/or said driver offset adjust signal.

31. The method of claim 24, wherein said step of inputting a voltage signal from a voltage source comprises inputting a plurality of differential analog input signals.

32. The method of claim 31, wherein in said step of inputting a plurality of differential analog input signals, said analog input signals are coupled to a high pass filter, wherein said high pass filter is coupled to a common mode control circuit, and wherein said common mode control circuit provides a reference voltage level.

33. The method of claim 32, wherein said high pass filter is further coupled to a track and hold circuit comprising a clock signal, wherein said track and hold circuit samples said input voltage signal when said clock signal articulates into a hold polarity, and wherein differential outputs of said track and hold circuit are coupled into inputs of said driver.

34. The circuit of claim 32, wherein said high pass filter is further coupled to a sub circuit comprising a clock signal, wherein said sub circuit samples said analog input signal when said clock signal articulates into a hold polarity, and wherein differential outputs of said sub circuit are coupled into inputs of said driver.

35. The method of claim 24, wherein in said step of outputting a comparison result equaling $2^n-1$ digital outputs from said flash circuit, said flash circuit comprises $2^n-1$ comparators and a ladder resistor string, wherein said ladder resistor string provides a series of differential reference voltages of said $2^n-1$ comparators.

36. The method of claim 24, wherein multiple samples are taken in each step of said method.

* * * * *